United States Patent [19]

Otani et al.

[11] Patent Number: 4,853,642

[45] Date of Patent: Aug. 1, 1989

[54] PHASE CONTROLLED DEMODULATOR FOR DIGITAL COMMUNICATIONS SYSTEM

[75] Inventors: Susumu Otani; Motoya Iwasaki, both of Tokyo, Japan

[73] Assignee: NEC Corporation, Japan

[21] Appl. No.: 213,368

[22] Filed: Jun. 30, 1988

[30] Foreign Application Priority Data

Jun. 30, 1987 [JP] Japan .............................. 62-162668
Dec. 17, 1987 [JP] Japan .............................. 62-317508

[51] Int. Cl.$^4$ ............................................ H03D 3/00
[52] U.S. Cl. ...................................... 329/124; 331/4; 331/DIG. 2
[58] Field of Search ................... 329/122, 124; 331/4, 331/10–12, 25, DIG. 2; 455/260; 375/120

[56] References Cited

U.S. PATENT DOCUMENTS 4,423,390 12/1983 Waters ..................... 331/DIG. 2 X
4,724,401 2/1988 Hogge, Jr. et al. ....... 331/DIG. 2 X Primary Examiner—Eugene R. LaRoche
Assistant Examiner—Robert J. Pascal
Attorney, Agent, or Firm—Ostrolenk, Faber, Gerb & Soffen

[57] ABSTRACT

In a phase controlled demodulator, a modulated digital input signal is demodulated into quadrature signals with a carrier recovered by a voltage controlled oscillator. A phase difference between the quadrature signals is detected by a phase detector of Costas loop and applied through a loop filter to the voltage controlled oscillator to control the frequency and phase of the recovered carrier when the frequency deviation between the received and recovered carriers is within a phase control range. When the frequency deviation exceeds the phase control range, the output of the phase detector is a beat of the two carriers and a frequency sweep control voltage is applied to the VCO to search for the missing carrier. The magnitude of the beat is detected and compared with a predetermined threshold value. When the frequency deviation is far beyond the control range, the magnitude of the beat is lower than the threshold, but exceeds it at the instant the demodulator enters the control range, whereupon the frequency sweep control voltage is removed from the VCO.

10 Claims, 3 Drawing Sheets

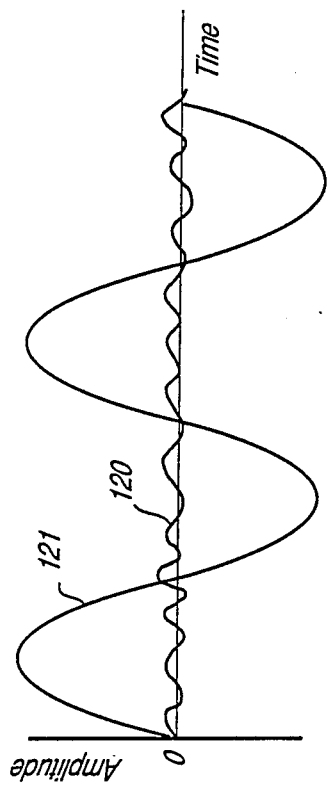
Fig. 3
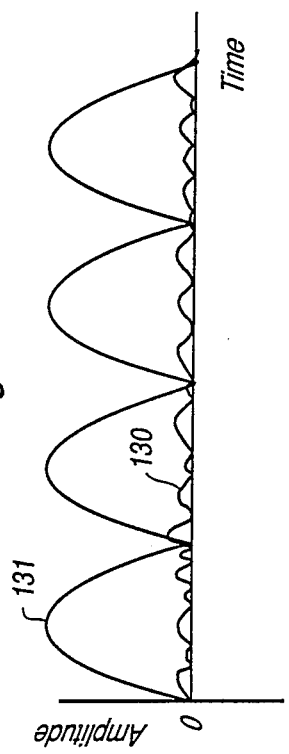
Fig. 4
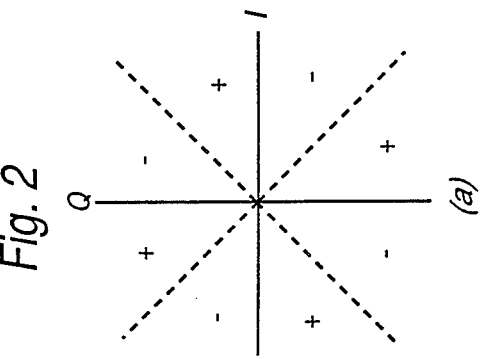
Fig. 2
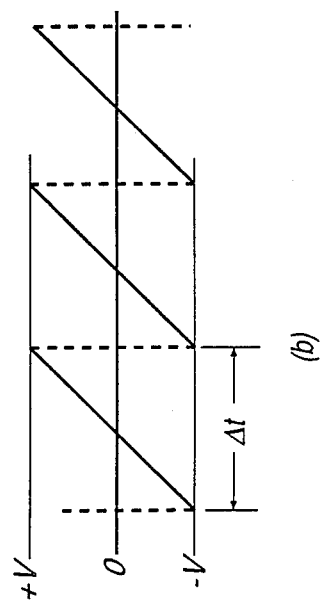

PHASE CONTROLLED DEMODULATOR FOR DIGITAL COMMUNICATIONS SYSTEM

BACKGROUND OF THE INVENTION

The present invention relates generally to demodulators for digital radio communications systems and more specifically to a phase controlled demodulator of the type wherein a frequency sweeping operation is effected when there is a large frequency difference between a received carrier and a recovered carrier.

In a satellite communications system, the demodulator at a receiving end suffers carrier frequency fluctuations due to the instabilities of the local oscillator of the satellite transponder. Frequency sweeping technique is currently employed to search for a missing carrier when the frequency deviation exceeds the phase control range of the demodulator. When the demodulator is pulled into the phase control range, the sweeping operation must be terminated to allow normal closed loop operation to be resumed. However, the conventional phase lock detector takes long to detect when the demodulator is phase locked and requires complex external circuitry.

SUMMARY OF THE INVENTION

It is therefore an object of the present invention to provide a phase controlled demodulator which is capable of quickly detecting a phase lock state with simplified circuitry.

In the phase controlled demodulator of the present invention, a modulated digital input signal is demodulated into quadrature signals with a carrier recovered by a voltage controlled oscillator. A phase difference between the quadrature signals is detected and applied through a loop filter to the voltage controlled oscillator to control the frequency and phase of the recovered carrier when the frequency deviation between the received and recovered carriers is within a phase control range. When the frequency deviation strays beyond the phase control range, a frequency sweep control voltage is applied to the voltage controlled oscillator to search for a missing carrier. The present invention is based on the fact that when the demodulator is out of sync, the output of the phase difference detector is a beat of the two carriers with an amplitude varying monotonically between positive and negative values.

According to the present invention, a phase lock detector is provided for detecting the magnitude of the beat and comparing it with a predetermined threshold value corresponding to an amount of frequency deviation which can occur within the phase control range. When the frequency deviation between the two carriers is far beyond the phase control range, the magnitude of the beat is lower than the threshold value, but exceeds the threshold at the instant the demodulator enters the phase control range. When this occurs, the phase lock detector generates an output for terminating the application of the frequency sweep control voltage to the VCO.

Preferably, the phase lock detector includes a low-pass filter connected to the output of the phase difference detector, a polarity inverter for inverting a first polarity of the beat frequency signal and combining the inverted polarity with a second, opposite polarity of the beat to produce a beat frequency signal of a uniform polarity. An average value of the uniform polarity beat signal is taken and compared with the threshold value. Alternatively, an integrator is connected to the output of the phase difference detector for comparing an integrated beat signal with the threshold value. The integrated signal increases beyond the threshold when the demodulator is pulled into the phase control range.

BRIEF DESCRIPTION OF THE DRAWINGS

The present invention will be described in further detail with reference to the accompanying drawings, in which:

FIGS. 2(a) and 2(b) are graphic illustrations of phase detection characteristic and the waveform of a beat at the output of the phase detector of FIG. 1;

FIG. 3 is an illustration of the waveform generated at the output of the low-pass filter of FIG. 1;

FIG. 4 is an illustration of the waveform generated at the output of the average value circuit of FIG. 1.

DETAILED DESCRIPTION

Figure 1:
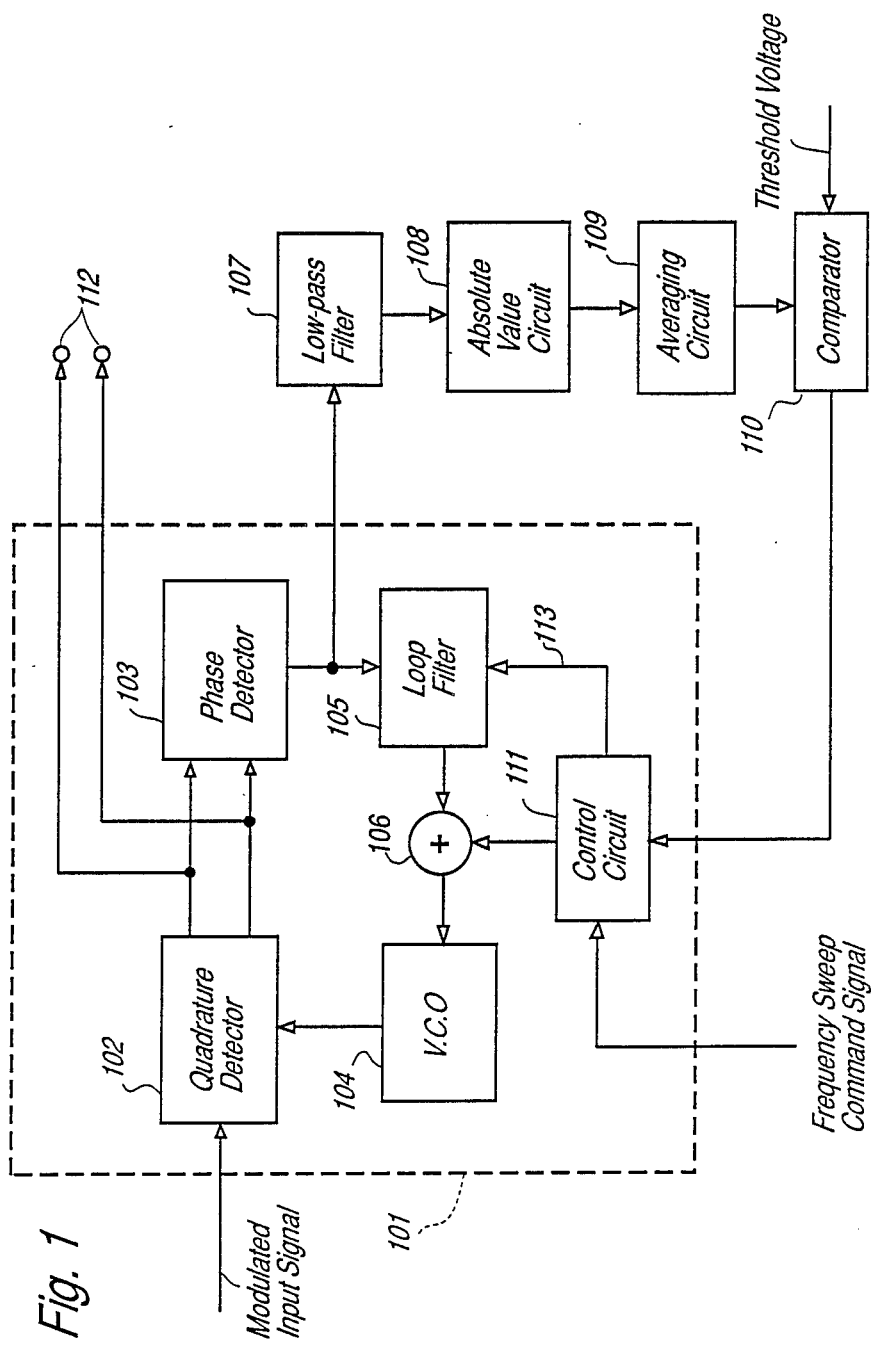
FIG. 1 is a block diagram of a phase controlled demodulator circuit according to the present invention.

Referring now to FIG. 1, there is shown a phase controlled demodulator circuit of a digital communications system according to the present invention. The demodulator circuit comprises a demodulator 101 and a phase lock detector including a low-pass filter 107, an absolute value circuit 108, an averaging circuit 109 and a comparator 110. The demodulator 101 is of a conventional design and includes a quadrature detector 102, a Costas-loop phase detector 103, a loop filter 105, an adder 106, a voltage controlled oscillator 104 and a control circuit 111.

Quadrature detector 102 includes inputs for receiving a modulated digital input signal such as 2PSK or 4PSK signal supplied over a satellite downlink, for example, and a recovered carrier from the voltage controlled oscillator 104 to perform quadrature demodulation to produce I and Q output signals which are made available at output terminals 112 and at the inputs of the phase detector 103. A phase difference between the I and Q signals is detected by the phase detector and fed through the loop filter 105 to one input of the adder 106 to which the output of the control circuit 111 is also connected. When the demodulator is in sync with the transmitter carrier, the loop output of loop filter 105 is coupled to the voltage controlled oscillator 104 to establish a phase locked loop. However, if it goes out of sync, the loop filter 105 is disabled by a signal supplied on lead 113 from the control circuit 111 an the latter supplies a frequency sweep control voltage via adder 106 to the voltage controlled oscillator 104 in response to a sweep command signal supplied from an out-of-phase lock detector, not shown, in order to sweep the recovered carrier across a wide range of frequencies in search of the frequency of the received carrier which is subject to change due to instabilities inherent in the satellite transponder.

The phase lock detector of the invention takes its input from the output of phase detector 103. As will be described hereinbelow, when the demodulator 101 goes out of sync, the output of Costas-loop phase detector 103 becomes a beat frequency signal having a frequency $2\Delta f$ for a 2PSK input and $4\Delta f$ for a 4PSK input carriers, where $\Delta f$ is the frequency difference between the received and recovered carriers. The output of phase detector 103 is filtered through the low-pass filter 107 and passed to the absolute value circuit 108 where the negative value of the input is converted to a positive value and combined with the original positive value and fed to the averaging circuit 109. An average value of the output of the absolute value circuit 108 is taken by the averaging circuit 109 and applied to one input of the comparator 110 where it is compared with a predetermined threshold voltage which represents a small frequency deviation which indicates that the demodulator is in the phase lock range. Comparator 110 generates an output at logic 1 or 0 depending on the relative values of the compared inputs and supplies it to the control circuit 111.

The operation of the phase lock detector of the invention will be best understood by reference to FIGS. 2 and 3.

If the demodulator input is a 4PSK signal, the phase detector 103 has four phase lock points lying on lines at $\pm 45°$ and $\pm 135°$ of the I-Q phasor diagram as shown in part (a) of FIG. 2, in which the plus and minus signs indicate the directions of phase advance and phase retard, respectively. If the phase of the transmitter carrier rotates in a given direction at a speed $2\pi\Delta ft$, the phase detector 103 will produce a waveform the amplitude of which varies monotonically between positive an negative values at periodic intervals $\Delta t (= \frac{1}{2}\Delta f)$ as shown in part (b) of FIG. 2.

The frequency range of the low-pass filter 107 is narrower than the phase lock range of the demodulator 101. If there is a large frequency deviation, the frequency of the output of phase detector 103 goes higher than the cutoff frequency of the low-pass filter 107, and so most of the frequency components of the phase difference signal is cut off by the low-pass filter 107 and noise prevails at the input of the absolute value circuit 108 as indicated by a waveform 120 in FIG. 3. As the frequency deviation decreases, the phase detector output decreases and a beat frequency signal as indicated by a waveform 121 appears at the output of low-pass filter 107. It is seen that the beat frequency signal has a much higher amplitude than the amplitude of the noise.

After having been processed by the absolute value circuit 108, the beat frequency signal appears as indicated by a waveform 130 in FIG. 4, while the noise appears as indicated by an a waveform 121. By averaging operation, the output of absolute value circuit 108 is converted to a DC voltage which is compared by the comparator 110 with the threshold voltage. Comparator 110 produces a logic 1 when the input DC voltage is higher than the threshold. Therefore, during an out-of-sync condition, the comparator 110 output is at logic 0 which causes the control circuit 111 to apply a disabling signal to loop filter 105 to cause it to terminate the application of its output to adder 106 and the control circuit 111 is supplied with a frequency sweep command signal. As the frequency sweep continues, the comparator output will eventually switch to logic 1 when the demodulator is approaching the boundary of the phase lock range.

When supplied with a logic 1 from the comparator 110, control circuit 111 removes the disabling signal from lead 113 and terminates the application of the sweeping voltage to adder 106. Therefore, the demodulator can be quickly pulled into the phase locked state as soon as the frequency deviation crosses the boundary of the phase lock range.

Figure 5:
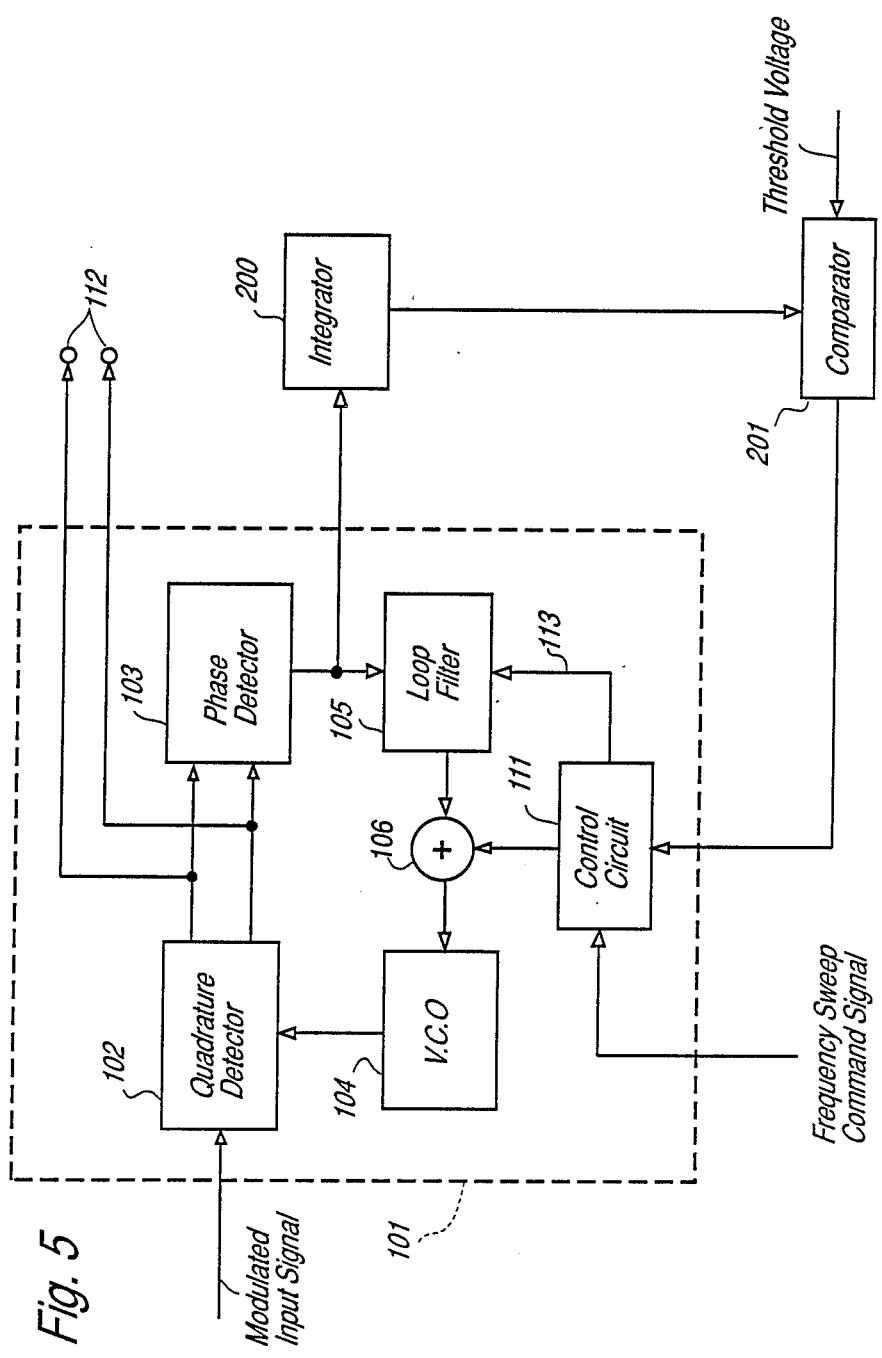
FIG. 5 is a block diagram of an alternative form of the present invention.

As shown in FIG. 5, the phase lock detector of the invention can alternatively be implemented by an integrator 200 and a comparator 201. The integrator 200 provides integration of the output of phase detector 103 over a time interval $\Delta T$ which is greater than the period of the beat frequency signal when the carrier frequency deviation is large and is equal to or greater than the period of the beat frequency signal when that deviation is small. Comparator 201 compares the output of integrator 200 with a threshold voltage and produces a pulse when the threshold is exceeded. Since the amplitude of the beat frequency signal varies between positive and negative values and the period of the signal increases with a decrease in the carrier frequency deviation, the integration of the beat frequency signal over time interval $\Delta T$ produces a low voltage when the demodulator is outside of the phase lock range. As the carrier frequency deviation decreases, the amplitude of the integrator output increases accordingly. When the demodulator approaches the phase lock range, the period of the beat frequency signal becomes equal to or greater than the time interval $\Delta T$ and the integrator 200 produces an output having an amplitude exceeding the threshold of the comparator 201.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A phase controlled demodulator, comprising:
   a voltage controlled oscillator for recovering a carrier, means for demodulating a modulated input signal with the recovered carrier to produce demodulated quadrature signals, a phase difference detector, coupled to the demodulating means, for detecting a phase difference between said demodulated quadrature signals, a loop filter connected to the output of said phase difference detector, means for supplying an output signal of said loop filter to said voltage controlled oscillator when said demodulator is phase-locked with a received carrier and supplying a frequency sweep control voltage to said voltage controlled oscillator when said demodulator is out of phase with said received carrier, means for detecting the magnitude of the output of said phase difference detector, and means for comparing the detected magnitude with a predetermined threshold value and terminating said frequency sweep control voltage when said detected magnitude exceeds said threshold value.

2. A phase controlled demodulator as claimed in claim 1, wherein said phase difference detector comprises a Costas loop.

3. A phase controlled demodulator as claimed in claim 1, wherein said magnitude detecting means comprises:
   a low-pass filter connected to the output of said phase difference detector;
   polarity inverting means for inverting a first polarity of the output of said phase difference detector and combining the inverted polarity with a second, opposite polarity of the output of said phase difference detector; and means for generating an average value of the output of said polarity inverting means and applying the average value to said comparing means.

4. A phase controlled demodulator as claimed in claim 1, wherein said magnitude detecting means comprises an integrator.

5. A phase controlled demodulator, comprising:
a voltage controlled oscillator;
first means for applying to a modulated input signal an output of the voltage controlled oscillator to produce, from said modulated input signal, a predetermined output;
second means for generating from said predetermined output a loop output;
third means for applying to the voltage controlled oscillator said loop output for maintaining a phased locked loop condition or a frequency sweeping output command, based on whether said output of said voltage controlled oscillator is in synchronization with a carrier signal associated with said modulated signal input; and
fourth means, coupled to said third means and responsive to said loop output, for disabling applying of said frequency sweeping output command, whenever a magnitude associated with said predetermined output is greater than a predetermined value.

6. A phase controlled demodulator as in claim 5, wherein said predetermined output constitutes a phase difference output signal associated with said modulated input signal and wherein said fourth means comprises an absolute value circuit for generating an absolute value of said phase difference output signal.

7. A phase controlled demodulator as in claim 6, wherein said fourth means further comprises an averaging circuit coupled to said absolute value circuit.

8. A phase controlled demodulator as in claim 7, wherein said fourth means further includes a comparator coupled to the averaging circuit and responsive to the predetermined value.

9. A phase controlled demodulator as in claim 8, further including a low pass filter disposed between the phase difference output signal and the absolute value circuit.

10. A phase controlled demodulator as in claim 6, wherein said first means is effective for producing demodulated quadrature signals from said modulated input signal and wherein said phase difference signal is derived from said demodulated quadrature signals.

* * * * *